United States Patent [19]

Bickerdike et al.

[11] 3,930,463

[45] Jan. 6, 1976

[54] VAPOR DEPOSITION APPARATUS INCLUDING A THREE-COMPARTMENT EVAPORATOR

[75] Inventors: Robert Lewis Bickerdike, Alton; Garyth Hughes; William Norman Mair, both of Farnham, all of England

[73] Assignee: The Secretary of State for Defense in Her Britannic Majesty's Government of the United Kingdom of Great Britain and Northern Ireland, London, England

[22] Filed: July 11, 1973

[21] Appl. No.: 378,129

[30] Foreign Application Priority Data

July 14, 1972  United Kingdom............... 33073/72

[52] U.S. Cl. ............................................. 118/49.1
[51] Int. Cl.² ......................................... C23C 13/12
[58] Field of Search ............ 118/49.1, 49.5; 65/346, 65/347; 13/26, 27; 219/271

[56] References Cited
UNITED STATES PATENTS

| | | | |
|---|---|---|---|
| 1,552,555 | 9/1925 | Grauel............................. | 65/341 X |
| 2,127,087 | 8/1938 | Mulholland........................... | 65/342 |
| 2,664,852 | 1/1954 | Chadsey, Jr. ......................... | 118/49 |
| 2,665,226 | 1/1954 | Godley et al. ...................... | 118/49 X |
| 2,665,227 | 1/1954 | Clough et al. ...................... | 118/49 X |
| 3,364,296 | 1/1968 | Smith, Jr......................... | 219/121 EB |
| 3,467,058 | 9/1969 | Box et al........................... | 118/49.5 |
| 3,640,762 | 2/1972 | Reed et al........................... | 118/48 X |

*Primary Examiner*—Morris Kaplan
*Attorney, Agent, or Firm*—Stevens, Davis, Miller & Mosher

[57] ABSTRACT

The evaporation of metal for the production of alloys by the deposition of the components from the vapour phase is carried out in a controllably heated source comprising a melting compartment, in which in operation the metal is melted; a mixing compartment, a constriction in the passage from the melting to the mixing compartment to minimise back mixing of the molten metal, and an evaporation compartment, the supply of metal from the mixing compartment to the evaporation compartment being below the surface of the molten metal. Heating is preferably by electron beam heating.

5 Claims, 3 Drawing Figures

VAPOR DEPOSITION APPARATUS INCLUDING A THREE-COMPARTMENT EVAPORATOR

The present invention is concerned with apparatus for the production of bulk alloys by deposition of the components from the vapour phase.

Processes for the production of bulk alloys by the deposition of the components from the vapour phase are known, see for example British Patent Specification Nos. 1,206,586 and 1,265,965, and a typical apparatus for such a process includes one or more controllably heated source means from which, in operation, the components of the alloy are evaporated, a temperature controllable collector upon which the metal is deposited, a removable shutter provided so that the metal impinges upon the collector only when desired, all enclosed in a controllable vacuum or low pressure system.

In accordance with the present invention a method of evaporating metal for a process as disclosed above includes melting the metal feed stock and providing for a substantial degree of mixing before the molten feed stock enters an evaporation compartment, the metal feed stock entering the evaporating compartment by a channel below the molten metal level, and being arranged so that the minimum of splats of metal which might impinge upon the deposit is produced. The evaporation compartment is heated by electron beam heating and preferably the metal feed stock is also melted by this means.

In accordance with an aspect of the present invention controllably heated source means for apparatus of the type disclosed above includes a melting compartment, in which in operation the metal is melted; a mixing compartment; a constriction between the melting and the mixing compartments to minimise back-mixing of the molten metal; and an evaporation compartment from which the metal is evaporated, the supply of molten metal from the mixing compartment to the evaporation compartment being below the surface of the molten metal in the evaporation compartment; at least the evaporation compartment and optionally the melting compartment is heated by electron beam heaters. Preferably the three compartments are enclosed in a cooled jacket.

The controllably heated source means of the present invention may be used when the alloy constituents may be co-evaporated from the same melt but it must be noted that the composition of vapour above the melt will in most instances differ from the composition of the melt. The composition of the vapour, and therefore of the deposit is determined by the composition and temperature of the melt. The composition of the feed metal must be same as the evaporated material otherwise a non-steady state will occur and the composition of the deposit will vary with time. The mixing compartment is provided to allow a substantial amount of mixing before the molten metal reaches the evaporating compartment. This purpose is aided by the constriction between the melting and mixing compartments. The constriction may be in the forming of a narrowing of the passageway or it may be a screen across the passage between the melting and mixing compartments having a slit through which the molten metal passes.

Where the composition of the vapour above a melt is not greatly different from a melt the need for mixing is not so important and the mixing compartment may be dispensed with.

In accordance with a further aspect of the present invention a single compartment is provided in which melting and mixing take place.

Preferably the melting compartment is also heated by electron beam heating and the mixing compartment may also be heated in like manner if necessary.

If the collector is small a single heated source means as disclosed may be sufficient but the number, extent and arrangement of evaporation compartments is selected to ensure adequate cover of the surface of the collector and two or more evaporation compartments may be provided with molten metal by a single pair of melting and mixing compartments, or by a single melting compartment and two or more mixing compartments. A single evaporation compartment may be served by two or more mixing compartments.

In accordance with a further aspect of the present invention a process of producing metals by deposition of the components from the vapour phase employs a controllably heated source means as above disclosed. Preferably the feed material to the melting compartment is in discrete quantities of substantially the desired constitution because as molten alloys or mixtures of metals solidify there is a tendency for one or more constituents to segregate to that portion of the ingot which solidified first. This can result in undesirable variations of the composition of the feed. The feed material may be a single ingot which has been cast may be minimised and the preferred method is to use as feed material an ingot as illustrated in FIG. 3. Such an ingot may be cast in such a manner that necks solidify first and early in the solidification so that each of the pieces between the necks have substantially the nominal composition of the original material. Preferably the feed material in a process of this aspect of the invention is an ingot which has been cast in such a manner that it comprises necks having between them positions of ingot having substantially the desired composition.

Apparatus of the present invention will now be described by way of example only and with reference to the accompanying drawings in which.

Figure 1:
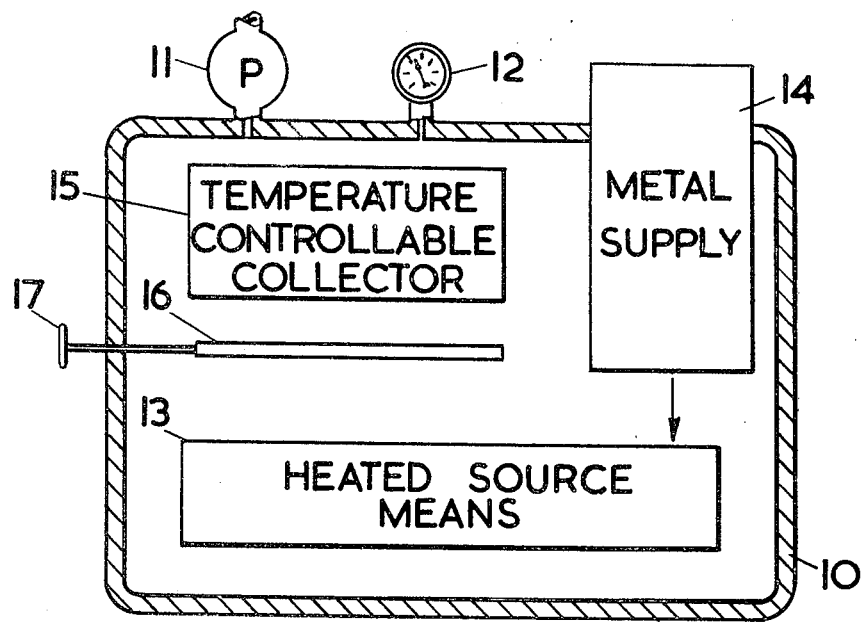
FIG. 1 is a schematic cross-sectional representation.

Referring now to FIG. 1, which is a schematic representation, a vacuum or low pressure vessel 10 is evacuated by a conventional vacuum pump 11 and a pressure gauge 12 is provided to monitor the pressure.

A heated source means 13 is provided with metal by a metal supply 14 and a temperature controllable collector 15 is provided upon which metal evaporated from the heated source means 13 may be deposited. A removable shutter 16 is provided operated by a handle 17 outside the vacuum vessel 10.

The temperature controllable collector may be of any known type and may be stationary or substantially stationary as disclosed in copending U.S. Ser. No. 377,658 filed July 9, 1973 now U.S. Pat. No. 3,887,001 or may be a rotary collector as disclosed in U.K. Patent Specification No. 1,279,975.

The metal supply means 14 is preferably provided with a vacuum lock so that it can be charged without breaking the vacuum in the vacuum vessel 10 and in duplicate so that one may be charged while the other is in operation and continuous operation achieved.

Figure 2:
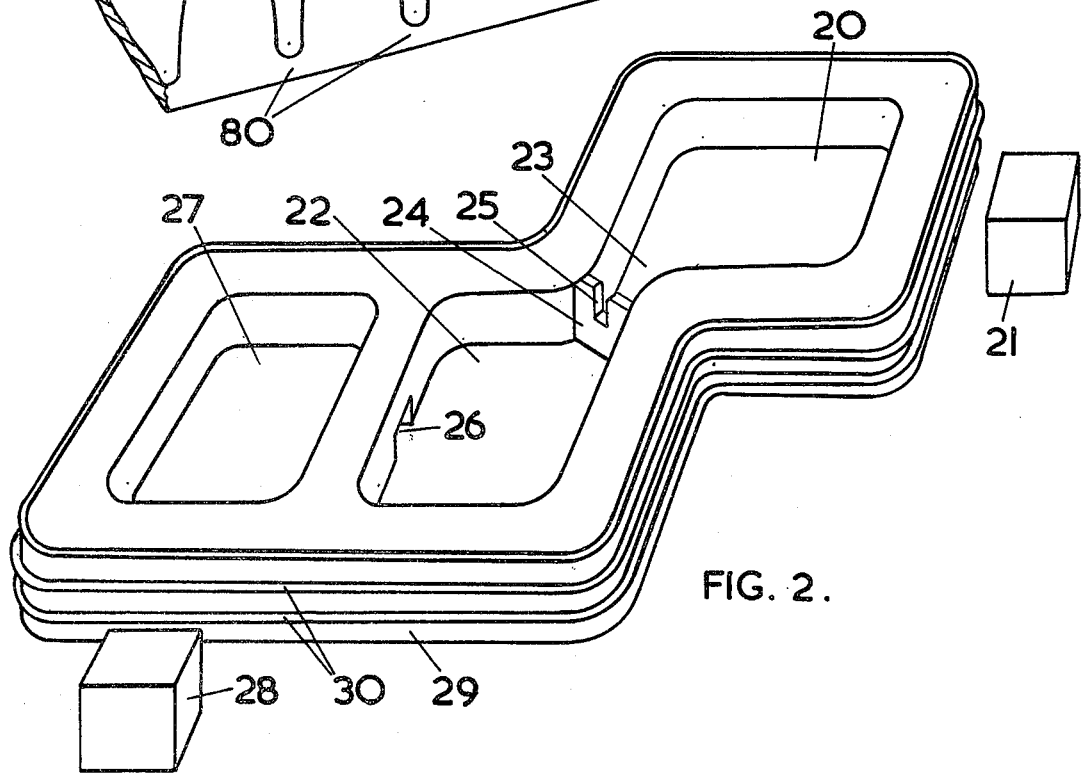
FIG. 2 is a perspective view of a controllably heated source means.

FIG. 2 illustrates a heated source means of the present invention and is shown empty so that the internal structure may be seen.

A melting compartment 20, heated by an electron gun 21 connects with a mixing compartment 22 through a channel 23 which contains a partition 24 with a slit 25 therein. The mixing compartment 22 connects through a channel 26 with an evaporation compartment 27 heated by an electron gun 28.

The compartments are enclosed in a copper cooling jacket 29 provided with copper pipes 30 for the circulation of cold water, the entrance and exit of which is not shown.

The material of the compartments is heat and corrosion resistant ceramic chosen to resist the particular molten metal intended to be used, and may be cast in a single piece. However it may be advantageous to make the compartments from separate pieces. For example if the compositions in the melting and mixing compartments differ sufficiently to have different corrosion characteristics. In addition each compartment may be made from a plurality of individual pieces of ceramic.

The fit of the various parts of the components need not be exact because as the molten metal passes along cracks between such parts it will solidify as it approaches the cooling jacket and seal the crack. The same mechanism will tend to seal up any cracks which form in the ceramic material during operation.

Figure 3:
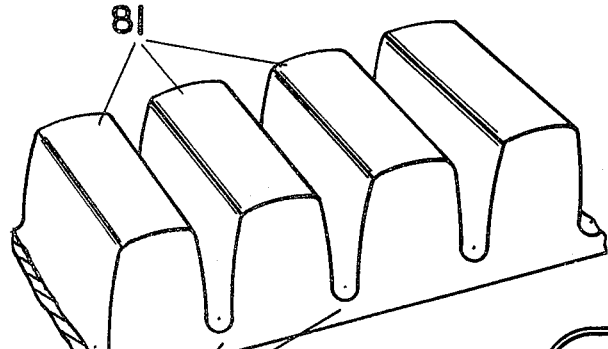
FIG. 3 is a shaped ingot of feed metal.

Well known means are available by which metal may be supplied to the heated source means but they all tend to have the disadvantage that as molten alloys or mixtures of metals solidify there is a tendency for one or more constituents to segregate to that portion of the ingot which solidifies first. This can result in undesirable variations of the composition of the feed. However this problem may be minimised and the preferred method is to use as feed material an ingot as illustrated in FIG. 3. Such an ingot may be cast in such a manner that the necks 80 solidify first and early in the solidification so that each of the pieces 81 has substantially the nominal composition of the original material. Such an ingot can be lowered vertically into the melting vessel in such a manner that each of the pieces 81 melts evenly at the surface of the melt and the minimum of gasification and splatting occurs. Once an entire portion 81 is melted the ingot is generally withdrawn until the next addition is required. By controlling the frequency at which pieces 81 are melted the material may be supplied to the heated source means at any desired rate.

The ingot may be lowered down a shaft which constitutes a vacuum lock so that once the ingot is consumed the shaft may be opened up to insert a new ingot without breaking the vacuum in the main vessel. The provision of two such ingot feed means permits continuous operation.

What I claim is:

1. An apparatus for evaporating metal and depositing the evaporated metal on a surface which comprises a housing enclosing a container for molten metal and a space above the container, means for evacuating the said space, said container being divided into three compartments which are laterally associated in series, a first said compartment associated with heating means for melting metal and a second said compartment for mixing molten metal and a third said compartment associated with means for heating metal to evaporate it, a constricted opening in the common wall between said first and second compartments for flow of molten metal from the first compartment to the second compartment which is adapted to minimize back flow from the second to the first compartment, and an opening limited to the base of the common wall between said second and third compartments whereby flow of metal from the second compartment to the third compartment occurs only under the surface of molten metal in the third compartment, and a substrate means for condensing evaporated metal disposed above the third compartment in said space.

2. A heated source as claimed in claim 1 wherein the heating means is electron beam heating.

3. A heated source as claimed in claim 1 wherein a plurality of evaporation compartments is served by single melting and mixing compartments.

4. A heated source as claimed in claim 1 wherein a single evaporation compartment is served by a plurality of melting and mixing compartments.

5. A heated source as claimed in claim 1 wherein the compartments of the heated source are composed of ceramic resistant to the molten metal and the whole source means is enclosed in a cooling jacket.

* * * * *